(12) United States Patent
Arita

(10) Patent No.: US 6,905,949 B2
(45) Date of Patent: Jun. 14, 2005

(54) SEMICONDUCTOR APPARATUS FABRICATION METHOD FORMING A RESIST PATTERN, A FILM OVER THE RESIST, AND REFLOWING THE RESIST

(75) Inventor: Toshiyuki Arita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/634,824

(22) Filed: Aug. 6, 2003

(65) Prior Publication Data

US 2004/0038549 A1 Feb. 26, 2004

(30) Foreign Application Priority Data

Aug. 26, 2002 (JP) .................................... 2002-245377

(51) Int. Cl.⁷ .................. H01L 21/22; H01L 21/38; H01L 21/311; H01L 21/302; H01L 21/461
(52) U.S. Cl. .................... 438/551; 438/694; 438/725; 438/945
(58) Field of Search .................. 438/551, 694, 438/725, 945

(56) References Cited

U.S. PATENT DOCUMENTS 6,602,794 B1 * 8/2003 Kye .......................... 438/725

FOREIGN PATENT DOCUMENTS

| JP | 62-215265 | | 9/1987 | |
|----|-----------|---|--------|---|
| JP | 7-45510 | | 2/1995 | |
| JP | 07-045510 | * | 2/1995 | ......... H01L/21/027 |
| JP | 11-145031 | | 5/1999 | |
| JP | 2001015479 A | * | 1/2001 | ......... H01L/21/306 |
| JP | 2001-332484 | | 11/2001 | |

OTHER PUBLICATIONS

Stanley Wolf Ph.D. and Richard N. Tauber Ph.D. in Silicon Processing for the VLSI Era, vol. 1: Process Technology, Lattice Press, 1986, pp. 365–368.*

* cited by examiner

Primary Examiner—Olik Chaudhuri
Assistant Examiner—William M. Brewster
(74) Attorney, Agent, or Firm—Westerman, Hattori, Daniels & Adrian, LLP

(57) ABSTRACT

A semiconductor apparatus fabrication method is capable of effectively suppressing edge roughness when an extremely fine resist pattern is formed. In the semiconductor apparatus fabrication method, the extremely fine resist pattern is covered with a film whose heat-resistance temperature is higher than the softening temperature of the resist pattern. In this state, the resist pattern is heated at a temperature higher than the softening temperature and lower than the heat-resistance temperature in order to cause reflow in the resist pattern.

18 Claims, 16 Drawing Sheets

SEMICONDUCTOR APPARATUS FABRICATION METHOD FORMING A RESIST PATTERN, A FILM OVER THE RESIST, AND REFLOWING THE RESIST

CROSS-REFERENCE TO RELATED APPLICATIONS

The present application is based on Japanese priority application No. 2002-245377 filed Aug. 26, 2002, the entire contents of which are hereby incorporated by reference.

BACKGROUND OF THE INVENTION

1. Field of the Invention

The present invention generally relates to a semiconductor apparatus fabrication method, and more particularly to a semiconductor apparatus fabrication method that includes processes for forming an ultra fine pattern by using a resist pattern.

2. Description of the Related Art

Recent advances in micro-fabrication techniques have realized ultra high-speed semiconductor apparatuses in which patterns of a gate electrode and a contact hole are formed under an approximately 0.1 $\mu$m design rule. Currently, it is being considered to use a 0.05 $\mu$m design rule and further a 0.01 $\mu$m design rule. When such an ultra high-speed semiconductor apparatus is fabricated, a resist is formed on a film whereupon a pattern is formed and then the resist is exposed and developed under the desired design rule. As a result, it is possible to obtain a fine resist pattern corresponding to the design rule and form the pattern on the underlayer by using the resist pattern as a mask.

When such a fine pattern is formed, deep ultra-violet light of short wavelength is used in order to enhance the resolution for resist exposure. The deep ultra-violet light is generated by KrF excimer laser (wavelength 248 nm), ArF excimer laser (wavelength 193 nm) or the like. In a conventionally used novolak system resist, however, the deep ultra-violet light is considerably absorbed into the resist. As a result, there arises insufficient exposure at the bottom of the resist. For this reason, when an ultra-fine semiconductor apparatus is fabricated under a design rule of less than 0.1 $\mu$m, a chemically amplified resist is generally used. Since the chemically amplified resist contains a photo acid generator, it is possible to change the solubility of the chemically amplified resist to an alkaline developer. Furthermore, the chemically amplified resist has high permeability to the deep ultra-violet light.

However, when a pattern to be formed has an even narrower width of 0.05 $\mu$m or 0.01 $\mu$m, a resist pattern cannot have a stable edge in terms of not only individual patterns but also the interior of one pattern due to a light contrast problem on exposure or a resist composition non-uniformity problem. Namely, edge roughness is caused. If the edge roughness results in size variations of the resist pattern, the sizes of a micro gate electrode pattern and a contact hole also vary because the resist pattern is used as the mask to transfer a pattern on the underlayer of the resist pattern.

Conventionally, the edge roughness problem has been challenged by improving uniformity of resist materials. However, it is difficult to overcome edge roughness by simply improving resist materials with respect to current ultra-micro semiconductor apparatuses in which the pattern size is less than 0.1 $\mu$m.

There is such a way that reflow is caused by heating a resist pattern so as to alleviate the edge roughness problem. However, if the resist pattern is heated, there is a risk that the resist pattern will be deformed as a whole.

Japanese Laid-Open Patent Application No. 2001-332484 discloses a technique for radiating light of such wavelength that a resist pattern can absorb the light for a short time so as to cause local reflow on only the surface of the resist pattern. In this conventional technique, since the chemically amplified resist thereof has permeability toward the ArF excimer laser and the KrF excimer laser, it is necessary to use extremely short wavelength light. However, it is difficult to prepare an illuminant suitable to such wavelength.

Japanese Laid-Open Patent Application No. 11-145031 discloses a technique for causing local reflow on the surface of a resist pattern. In this technique, the surface of the chemically amplified resist pattern is exposed to an acidic solution or an acidic atmosphere in order to eliminate a protecting group of a resist resin on the pattern surface and decrease softening temperature on the resist pattern surface. In this conventional technique, however, if the softening temperature does not sufficiently decrease, the reflow arises not only on the pattern surface but also throughout the entire pattern. As a result, the resist pattern is deformed.

In order to make the resist pattern surface smooth, there is such a way that an ashing process is performed for the formed resist pattern surface by using oxygen plasma. In this case, however, it is impossible to avoid reduction of the pattern size. Accordingly, especially, in order to form a line and space pattern, it is necessary to increase the width of the line part thereof so as to compensate for the size reduction due to the ashing process. However, if the line part increases, the width of the space part decreases. As a result, it is necessary to perform exposure at the limit of exposure resolution, and there arise serious problems on the yield and the throughput.

As mentioned above, no effective method for improving the edge roughness of a fine resist pattern has been proposed.

SUMMARY OF THE INVENTION

It is a general object of the present invention to provide a novel and useful semiconductor apparatus fabrication method in which the above-mentioned problems are eliminated.

A more specific object of the present invention is to provide a semiconductor apparatus fabrication method that can make rough edges smooth without deformation of a resist pattern for forming a pattern therein.

In order to achieve the above-mentioned objects, there is provided according to one aspect of the present invention a semiconductor apparatus fabrication method, comprising the steps of: forming a resist pattern; forming a film, whose heat-resistance temperature is higher than the softening temperature of the resist pattern, so as to cover the resist pattern; heating the resist pattern at a temperature higher than the softening temperature of the resist pattern and lower than the heat-resistance temperature of the film in a state where the film covers the resist pattern in order to cause reflow; removing the film; and patterning an underlayer of the resist pattern by using the resist pattern in which the reflow is caused as a mask.

In the above-mentioned semiconductor apparatus fabrication, the film may be an organic film whose softening temperature, which serves as the heat-resistance temperature, is higher than the softening temperature of the resist pattern.

In the above-mentioned semiconductor apparatus fabrication, the organic film may be soluble in one of an organic solvent and water.

In the above-mentioned semiconductor apparatus fabrication, the organic film may be selected from a group of polyacrylic acid, polyvinylacetal, polyvinylpyrrolidone, polyvinylalcohol, polyethyleneimine, polyethyleneoxide, styrene-(anhydrous) maleic acid copolymer, methylvinylether-(anhydrous) maleic acid copolymer, polyvinyl amine resin, polyallylamine, water soluble oxazoline group containing resin, water soluble melamine resin, water soluble urea resin, alkyd resin, and sulfonamide resin.

In the above-mentioned semiconductor apparatus fabrication, the organic film may be selected from a group of polyimide, polyacetal, polybutylene terephthalate, polyethylene terephthalate, syndiotactic polystyrene, poly phenylene sulfide, polyetherether ketone, liquid crystal polymer, fluorine resin, polyethernitrile, polycarbonate, modified poly phenyleneether, polysulfone, polyethersulfone, polyalylate, polyacrylate, polyamide-imide, thermoplastic polyimide, phenol resin, urea resin, melamine resin, alkyd resin, unsaturated polyester, epoxy resin, diallyl phthalate resin, silicon resin, and polyurethane.

In the above-mentioned semiconductor apparatus fabrication, the step of forming the film may include a coating step.

Additionally, the above-mentioned semiconductor apparatus fabrication further may include a step of accreting a release agent on a surface of the resist pattern after the step of forming the resist pattern and before the step of forming the film.

In the above-mentioned semiconductor apparatus fabrication, the film may be an inorganic film whose melting point, which serves as the heat-resistance temperature, is higher than the softening temperature of the resist pattern.

In the above-mentioned semiconductor apparatus fabrication, the inorganic film may be formed in accordance with one of a coating method, a sputtering method and a plasma CVD method.

In the above-mentioned semiconductor apparatus fabrication, the film may be a metal film whose melting point, which serves as the heat-resistance temperature, is higher than the softening temperature of the resist pattern.

In the above-mentioned semiconductor apparatus fabrication, the metal film may be formed in accordance with a sputtering method.

In the above-mentioned semiconductor apparatus fabrication, the resist pattern may be formed as a convex pattern on the underlayer.

In the above-mentioned semiconductor apparatus fabrication, the resist pattern may have an aperture for exposing the underlayer.

In the above-mentioned semiconductor apparatus fabrication, the underlayer may be a semiconductor film.

In the above-mentioned semiconductor apparatus fabrication, the underlayer may be an inorganic insulation film.

In the above-mentioned semiconductor apparatus fabrication, the underlayer may be an organic insulation film.

In the above-mentioned semiconductor apparatus fabrication, the underlayer may retain an antireflection film.

Additionally, the above-mentioned semiconductor apparatus fabrication further may include a step of patterning a film under the underlayer by using the underlayer as a mask.

According to the above-mentioned inventions, a fine resist pattern is covered with a film whose heat-resistance temperature is higher than the softening temperature of the resist pattern. If the resist pattern is heated at a temperature higher than the softening temperature of the resist pattern and lower than the heat-resistance temperature of the film, it is possible to eliminate the edge roughness of the resist pattern under restriction by the film and make the surface of the resist pattern smooth. An organic film, an inorganic film or a metal film may be used as the film. Also, the resist pattern may be a convex pattern such as a gate electrode pattern or a concave pattern such as a contact aperture. Additionally, although a semiconductor apparatus may directly use an underlayer in which a pattern is formed by using the resist pattern as the mask, the underlayer may be used as a hardmask for patterning a further underlayer. It should be noted that the heat-resistance temperature of a film means the temperature at which deformation of the film starts. In a resin film and glass, the heat-resistance temperature corresponds to the softening temperature. In an inorganic film and a metal film, the heat-resistance temperature corresponds to the melting point.

Other objects, features and advantages of the present invention will become more apparent from the following detailed description when read in conjunction with the accompanying drawings.

DETAILED DESCRIPTION OF THE PREFERRED EMBODIMENTS

In the following, embodiments of the present invention will be described with reference to the accompanying drawings.

A description will now be given, with reference to FIGS. 1A through 1F, of a semiconductor apparatus fabrication method according to the first embodiment of the present invention.

Figure 1A:
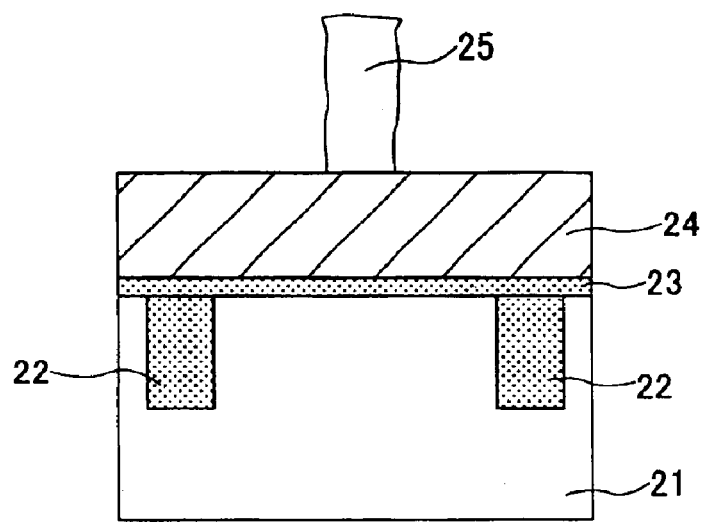
FIGS. 1A through 1F are diagrams for explaining fabrication processes of a semiconductor apparatus fabrication method according to a first embodiment of the present invention.

Referring to FIG. 1A, an element separation area 22 and an insulation film 23, which serves as a gate insulation film, are formed on a silicon substrate 21. In addition, a polysilicon film 24 is formed on the insulation film 23 as a gate electrode.

In a process illustrated in FIG. 1A, a chemically amplified resist is formed on the polysilicon film 24 via an organic or an inorganic antireflection film, which is not illustrated in FIG. 1A. Then, when the chemically amplified resist is exposed and developed, it is possible to form a resist pattern 25 corresponding to the desired gate electrode pattern.

For instance, such a chemically amplified resist may be formed of an ArF chemically amplified resist PAR-101 manufactured by Sumitomo Chemical Co., Ltd. In this case, the ArF chemically amplified resist PAR-101 is coated with a thickness of 300 nm, and this chemically amplified resist has the softening temperature of 150° C.

Then, the chemically amplified resist is pre-baked for 60 seconds at 100° C. and is exposed by the ArF excimer laser. After a post exposure baking process for 60 seconds at 115° C., if the chemically amplified resist is developed for 30 seconds in organic alkaline developer, it is possible to form the resist pattern 25, for instance, in a shape corresponding to a gate electrode of gate length 0.10 $\mu$m. Here, the resist pattern 25 has an undulating sidewall with respect to not only the horizontal direction but also the extending direction of the pattern, that is, the line direction. Namely, edge roughness is caused thereon. In a line and space pattern, the edge roughness varies the line width. Also, in a contact hole, although the sidewall should have circular shape, an undulating sidewall is generated.

Figure 1B:
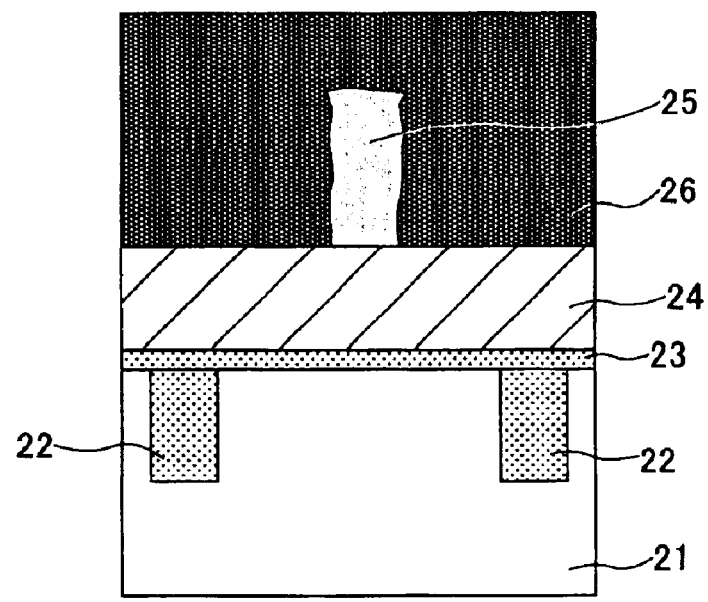

In a process illustrated in FIG. 1B, the semiconductor apparatus fabrication method according to the first embodiment spin-coats a resin composition of adamantyl acrylate 10% and xylene 90% on the structure shown in FIG. 1A. In addition, the resin composition is heated in an oven for 20 minutes at 110° C. As a result, it is possible to form a resin film 26 of about 400 nm in thickness in a state where the resist pattern 25 is coated. Here, the formed resin film 26 has a thermal decomposition temperature of 230° C. through 250° C., higher than the softening temperature of the resist pattern 25.

Figure 1C:
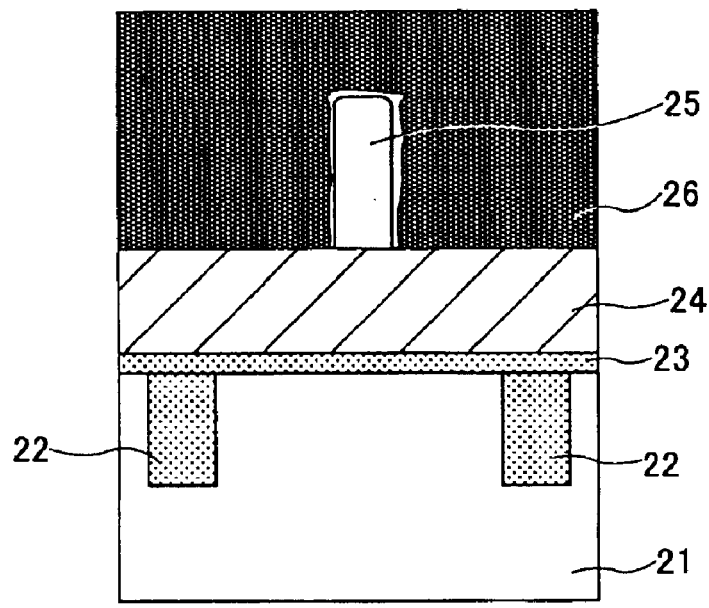
Figure 1D:
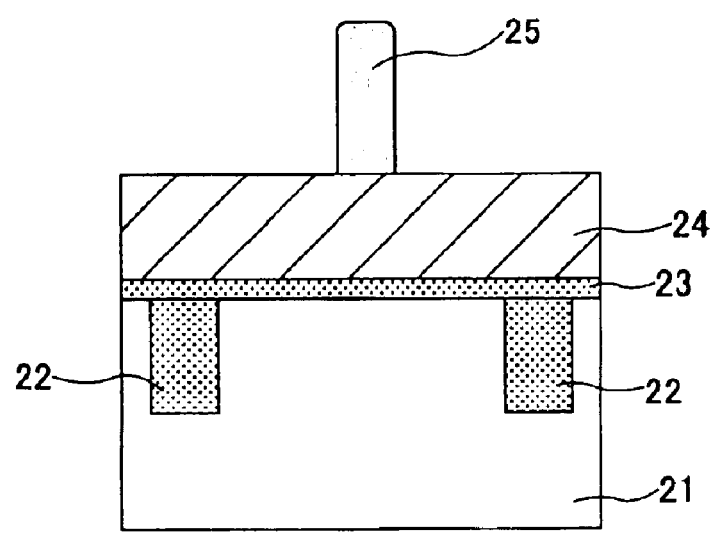

In a process illustrated in FIG. 1C, the structure shown in FIG. 1B is placed on a hot plate and is heated for 60 seconds at 180° C., higher than the softening temperature of the resist pattern 25 and lower than the softening temperature of the resin film 26. As a result, reflow is caused in the resist pattern 25, and it is possible to eliminate the edge roughness by surface tension and obtain the smooth sidewall of the resist pattern 25.

It should be noted that the resin film 26 is not softened in this process. Accordingly, since the reflow is caused in the resist pattern 25 under restriction by the resin film 26, it is possible to avoid deformation of the entire resist pattern 25 and maintain the shape thereof corresponding to a desired gate electrode pattern even if the resist pattern 25 is heated.

Here, the resin film 26 is soluble in xylene. Accordingly, when the structure shown in FIG. 1C is impregnated in xylene in a process illustrated in FIG. 1D, it is possible to remove the resin film 26.

Figure 1E:
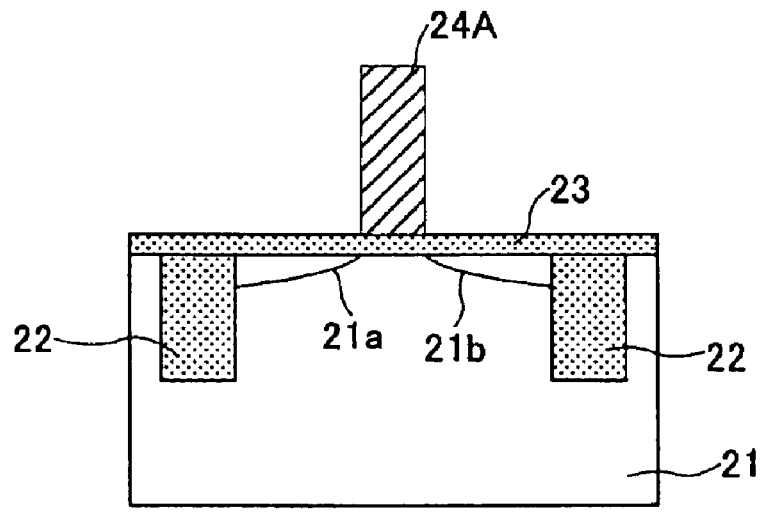

In a process illustrated in FIG. 1E, when the resist pattern 25 is used as the mask to pattern the polysilicon film 24, it is possible to obtain a desired gate electrode 24A. As mentioned above, since the reflow is caused in the resist pattern 25 under the restriction by the resin film 26, it is possible to eliminate only the edge roughness without deformation of the entire resist pattern 25. As a result, if the resist pattern 25 is used as the mask to pattern the polysilicon film 24, it is possible to form the gate electrode 24A having the desired gate length with high repeatability and accuracy.

Furthermore, if a p-type impurity element or an n-type impurity element is ion-implanted into the silicon substrate 21 by using the polysilicon electrode pattern 24A as the mask, it is possible to obtain source extension areas 21a and 21b in both sides of the gate electrode pattern 24A.

Figure 1F:
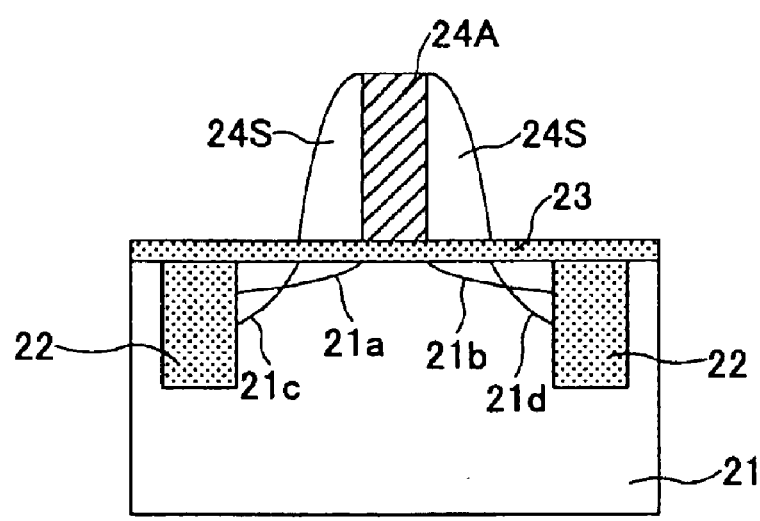

In a process illustrated in FIG. 1F, a sidewall insulation film 24S is provided on both sidewalls of the gate electrode 24A. If a p-type impurity element or an n-type impurity element is ion-implanted by using the gate electrode 24A and the sidewall insulation film 24S as the mask, it is possible to form a source diffusion area 21c and a drain diffusion area 21d in the exterior of the sidewall insulation film 24S in the silicon substrate 21.

In the first embodiment, the resin film 26 is formed of a xylene soluble adamantyl metacrylate system in order to avoid the deformation of the resist pattern 25 in the reflow process in FIG. 1C. However, the resin film 26 may be formed of a water soluble material instead of the xylene soluble material.

For instance, if 10% methylvinylether-maleic acid copolymer diluted with water, which is distributed by Daicel Chemical Industries, LTD. as the product name "VEMA", is coated on the structure in FIG. 1A in the process in FIG. 1B and the coated structure is heated for 20 minutes at 110° C., it is possible to obtain the water soluble resin film 26. In this case, the water soluble resin film 26 has the softening temperature of 220° C. through 225° C. Accordingly, since the water soluble resin film 26 is not deformed in the reflow process in FIG. 1C, it is possible to effectively suppress the deformation of the resist pattern 25.

Additionally, if 10% polyalylate resin PAR5 diluted with xylene, which is distributed by Unitika, LTD., is coated on the structure in FIG. 1A in the process in FIG. 1B and the coated structure is heated for 20 minutes at 110° C., it is also possible to obtain the xylene soluble resin film 26. In this case, the xylene soluble resin film 26 has the softening temperature 235° C. Accordingly, since the xylene soluble resin film 26 is not deformed in the reflow process in FIG. 1C, it is possible to effectively suppress the deformation of the resist pattern 25.

Additionally, the resin film 26 is not limited to the above-mentioned type films. It is possible to use a film that has higher softening temperature without mixture with the resist pattern 25 and is soluble with water or other solvents as follows: polyacrylic acid, polyvinylacetal, polyvinylpyrrolidone, polyvinylalcohol, polyethyleneimine, polyethyleneoxide, styrene-(anhydrous) maleic acid copolymer, methylvinylether-(anhydrous) maleic acid copolymer, polyvinyl amine resin, polyallylamine, water soluble oxazoline group containing resin, water soluble melamine resin, water soluble urea resin, alkyd resin, and sulfonamide resin. Here, the resin 26 may include water, an organic solvent and gas according to necessity.

Even in a film insoluble in water and any organic solvent, if the film can be selectively etched toward the resist pattern 25, it is possible to use the film as the film 26. In some cases, even if the film is insoluble in water and any organic solvent, it is possible to use the film as the film 26 because of thermal crosslink caused by heating. When the film 26 is insoluble in water solution and a solvent, the film 26 can be removed through selective etching in the process in FIG. 1D.

For instance, the following materials may be used as the water insoluble resin 26: polyimide, polyacetal, polybutylene terephthalate, polyethylene terephthalate, syndiotactic polystyrene, poly phenylene sulfide, polyetherether ketone, liquid crystal polymer, fluorine resin, polyethernitrile, polycarbonate, modified poly phenyleneether, polysulfone, polyethersulfone, polyalylate, polyacrylate, polyamide-imide, thermoplastic polyimide, phenol resin, urea resin, melamine resin, alkyd resin, unsaturated polyesther, epoxy resin, diallyl phthalate resin, silicon resin, and polyurethane.

Figure 2:
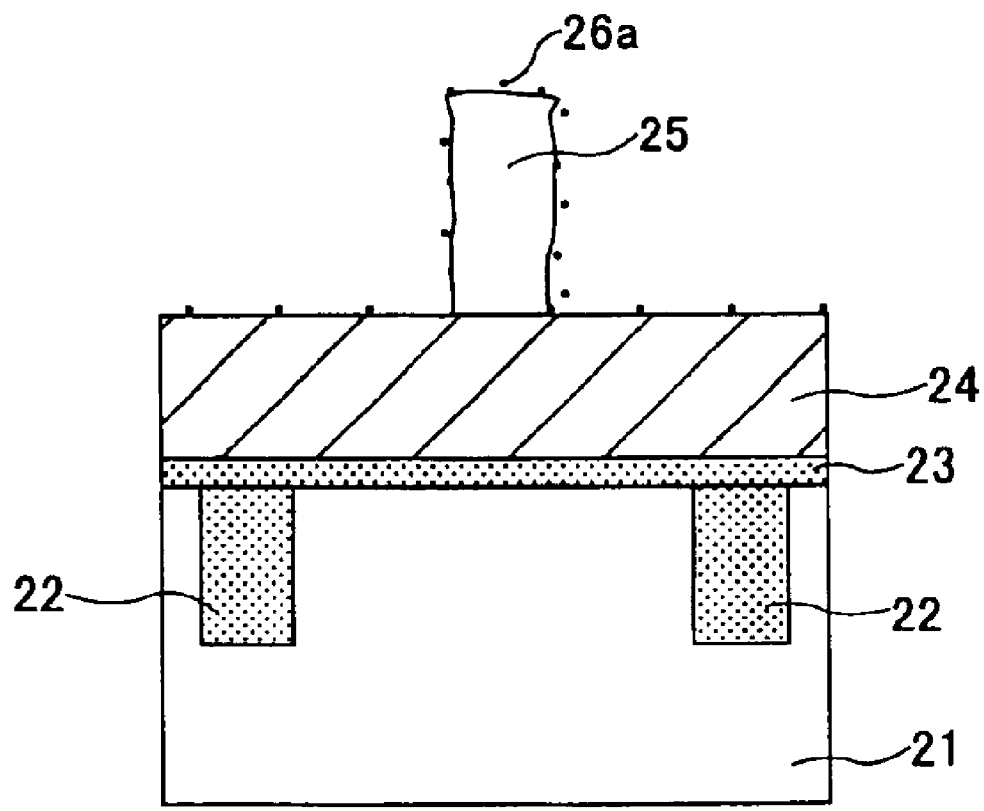
FIG. 2 is a diagram for explaining a variation of the semiconductor apparatus fabrication method according to the first embodiment.

As is shown in FIG. 2, when a processing material 26a is accreted on the surface of the resist pattern 25, it is possible to suppress the mixture of the resist pattern 25 and the film 26. A water-soluble extremly thin film can be used as the processing material 26a.

A description will now be given, with reference to FIG. 3A through 3F, of a semiconductor apparatus fabrication method according to the second embodiment of the present invention wherein the same parts as those parts described above are designated by the same reference numerals and the description thereof is omitted.

Figure 3A:
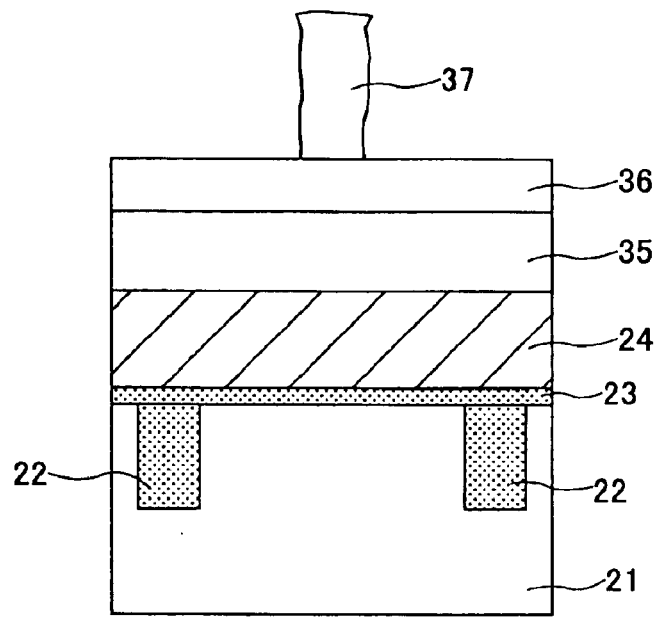
FIGS. 3A through 3F are diagrams for explaining fabrication processes of a semiconductor apparatus fabrication method according to a second embodiment of the present invention.

Referring to FIG. 3A, the semiconductor apparatus fabrication method according to the second embodiment provides a silicon oxide film 35, which is used as a hard mask, on the polysilicon film 24 and provides an antireflection film 36 formed of an insulation film such as SiN on the silicon oxide film 35. Additionally, an adamantyl acrylate system chemically amplified resist film is formed on the antireflection film 36. When a high resolution exposure apparatus exposes and develops the adamantyl acrylate system chemically amplified resist film as in the first embodiment, a resist pattern 37 is formed.

As is shown in FIG. 3A, edge roughness arises in the resist pattern 37. In the second embodiment, an inorganic insulation film 38 such as SOG is provided on the structure of FIG. 3A in a coating process in FIG. 3B. Here, the insulation film 38 may be an SiO2 film that can be deposited at a temperature lower than the softening temperature of the resist pattern 37 in accordance with a low temperature process such as the PVD (Physical Vapor Deposition) method and the plasma CVD (Chemical Vapor Deposition) method. In this case, since the insulation film 38 is removed later, only physical intensity is required for the insulation film 38. It is unnecessary to perform the baking process at high temperature in order to achieve particular excellent electrical characteristics and chemical stability.

Figure 3B:
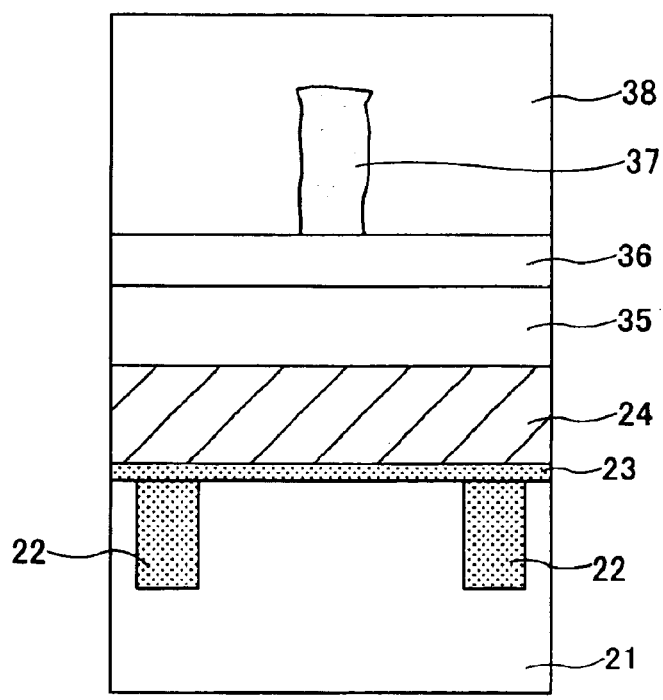

Instead of the insulation film 38, a metal film may be formed in accordance with the sputtering method in the process in FIG. 3B. Conventionally, the liftoff method is widely used to deposit a metal film on a resist film. In this case, a similar method is applicable to deposit the metal film. In the following description, it is assumed that the film 38 includes a metal film in addition to an insulation film.

Figure 3C:
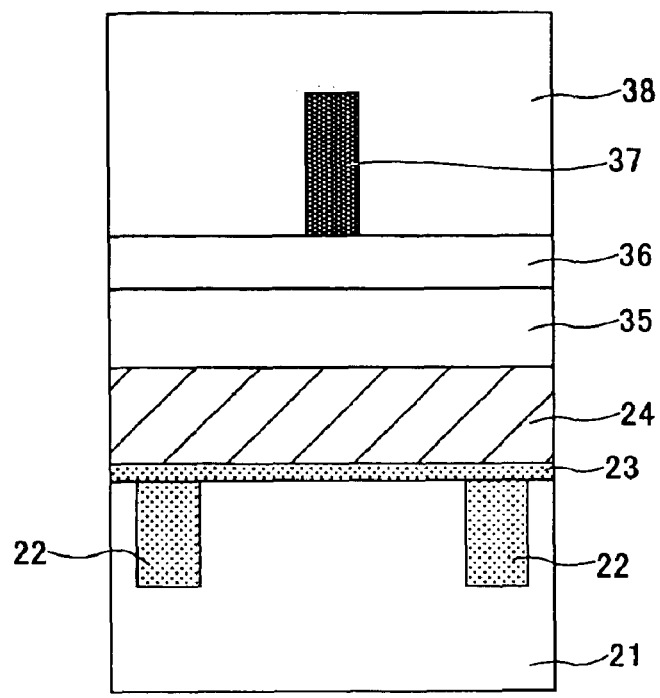

In a process in FIG. 3C, the structure in FIG. 3B is heated for short time to about 180° C., higher than the softening temperature of the resist pattern 37. As a result, reflow is caused in the resist pattern 37 under restriction by the film 38, and it is possible to obtain the resist pattern 37 from which the edge roughness is eliminated.

Figure 3D:
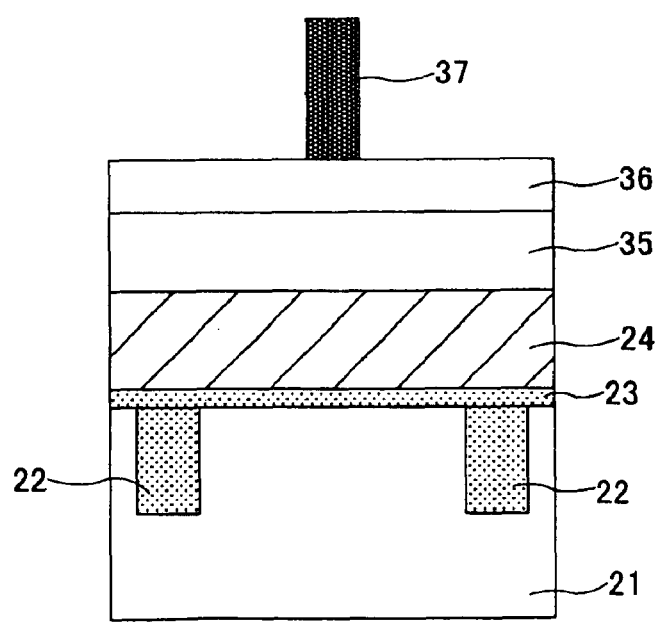

In a process illustrated in FIG. 3D, the film 38 is removed through etching, and it is possible to obtain the structure in which the antireflection film 36 is exposed. In the process in FIG. 3D, if the film 38 is an oxide film, Hf (hafnium) can be used for the etching of the film 38. If the film 38 is a metal film, an appropriate acid can be used for the etching of the film 38.

Figure 3E:
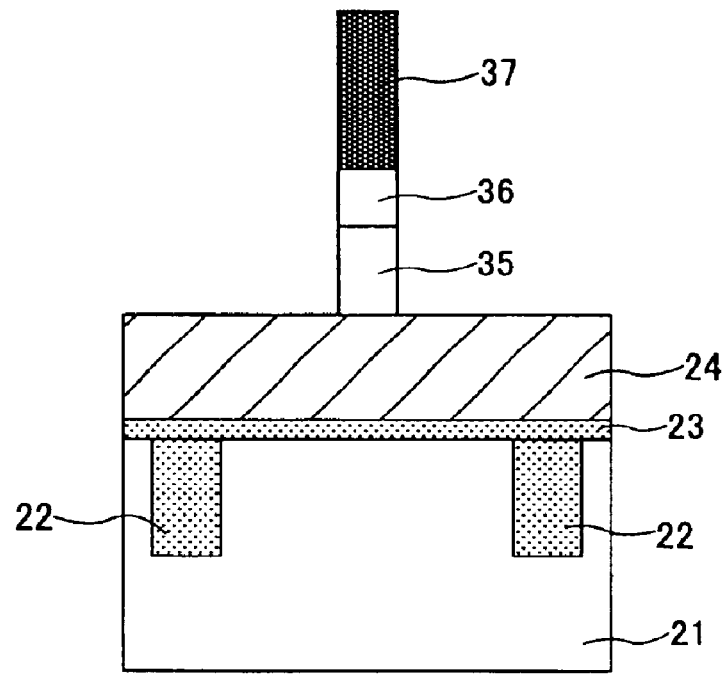

In a process illustrated in FIG. 3E, the antireflection film 36 and a hardmask layer 35 are patterned by using the resist pattern 37 as the mask. In a process illustrated in FIG. 3F, the polysilicon film 24 is patterned by using the hardmask layer 35 as the mask, and then the gate electrode 24A is formed.

Figure 3F:
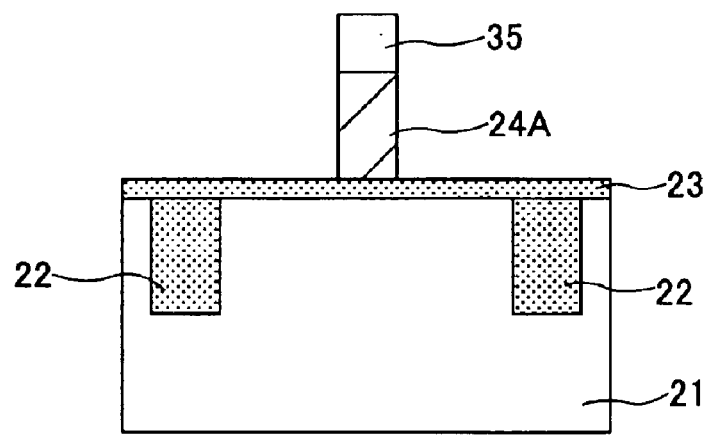

Processes in the lower stream from the process in FIG. 3F are similar to the above-mentioned processes with respect to FIGS. 1E and 1F and the description thereof is omitted.

In the semiconductor apparatus fabrication method according to the second embodiment, since the hardmask layer 35 is used to pattern the polysilicon film 24, it is possible to use an exposure optical system of slight focal depth and form the gate electrode pattern 24A at high resolution.

A description will now be given, with reference to FIGS. 4A through 4F, of a semiconductor apparatus fabrication method according to the third embodiment of the present invention.

Figure 4A:
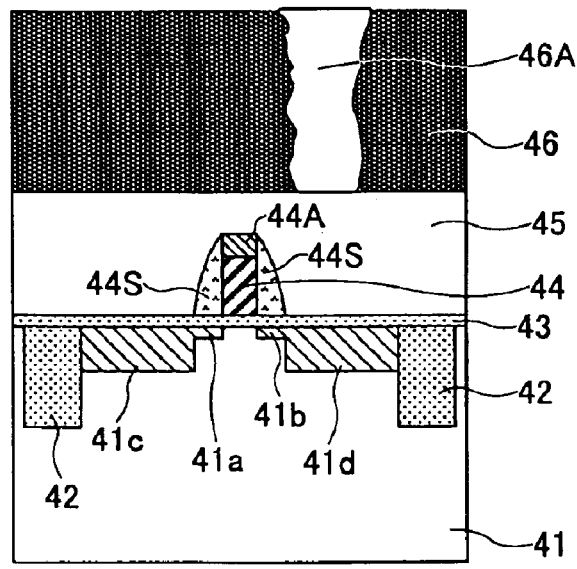
FIGS. 4A through 4F are diagrams for explaining fabrication processes of a semiconductor apparatus fabrication method according to a third embodiment of the present invention.

Referring to FIG. 4A, an element area is defined on a silicon substrate 41 by providing an element separation area 42, and a gate electrode 44 is formed in the element area on the substrate 41 via a gate insulation film 43. Furthermore, an n-type or p-type source extension area 41a is formed in one side of the gate electrode 44 on the substrate 41, and an n-type or p-type drain extension area 41b is formed in the other side.

The gate electrode 44 retains a silicide low resister layer 44A in the upper side thereof and sidewall insulation films 44S on the both sidewalls thereof. Furthermore, an n-type or p-type source diffusion area 41c and an n-type or p-type drain area 41d are provided in the exterior of the sidewall insulation films 44S in the silicon substrate 41.

An inter-layer insulation film 45 is provided on the silicon substrate 41 so as to cover the gate electrode 44. A resist 46 having a resist aperture 46A is formed on the inter-layer insulation film 45 corresponding to a contact hole to be formed in the inter-layer insulation film 45.

It is necessary to reduce the size of the contact hole to be formed in the inter-layer insulation film 45 as much as possible in response to miniaturization of a semiconductor apparatus. For this reason, a chemically amplified resist is used to expose the resist 46 at high resolution by deep ultra-violet light such as the ArF excimer laser as in the above-mentioned embodiments.

Figure 4B:
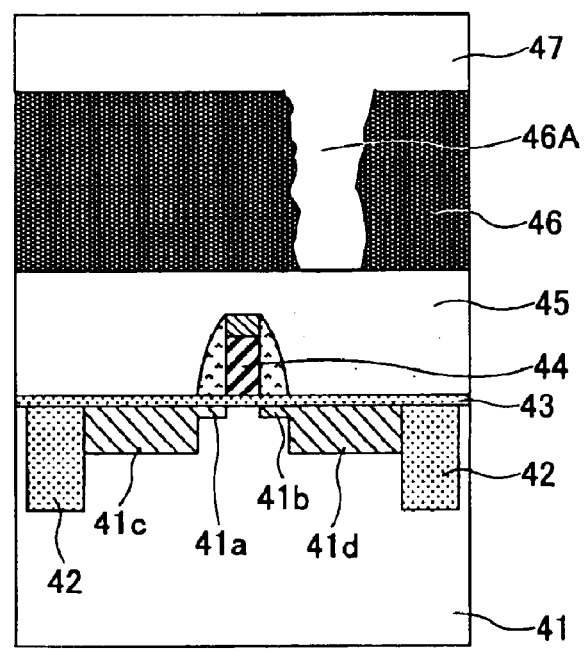
Figure 4C:
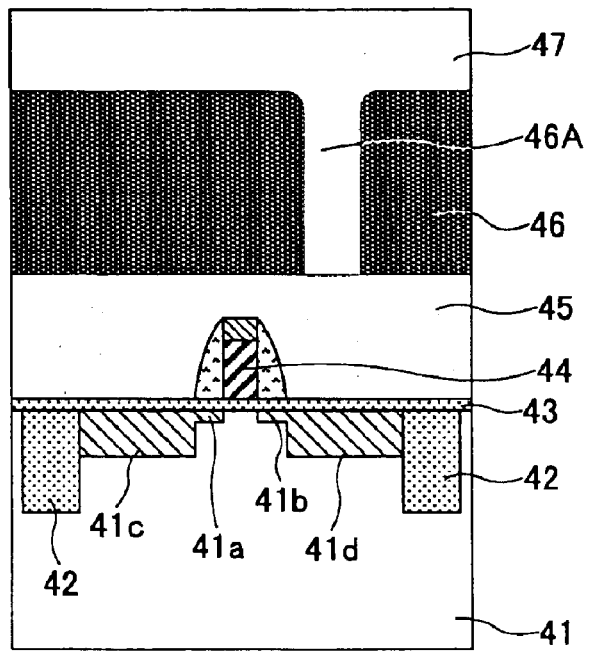

In a process illustrated in FIG. 4B, a film 47 is provided on the structure in FIG. 4A to fill the resist aperture 46A wherein the film 47 is formed of a resin film, an inorganic insulation film or a metal film as mentioned above. In a process illustrated in FIG. 4C, the structure in FIG. 4B is heated at a temperature higher than the softening temperature of the resist 46 and lower than the heat-resistance temperature of the film 47. As a result, reflow is caused in the resist 46 in a state where the film 47 suppresses deformation of the resist 46, and it is possible to eliminate the edge roughness of the sidewall of the resist aperture 46A.

Figure 4D:
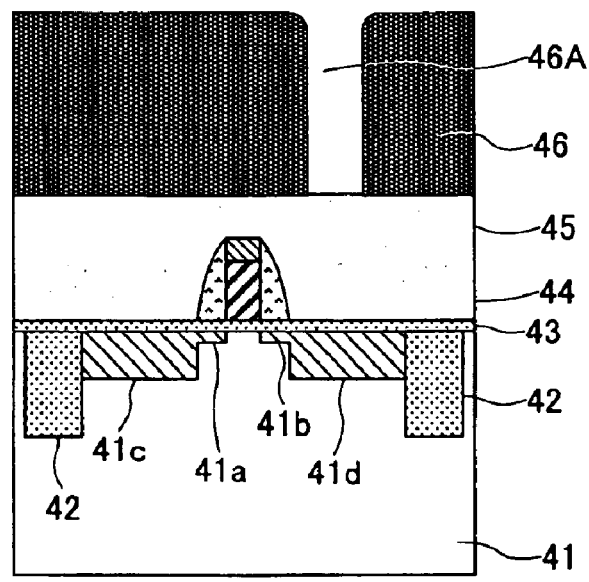
Figure 4E:
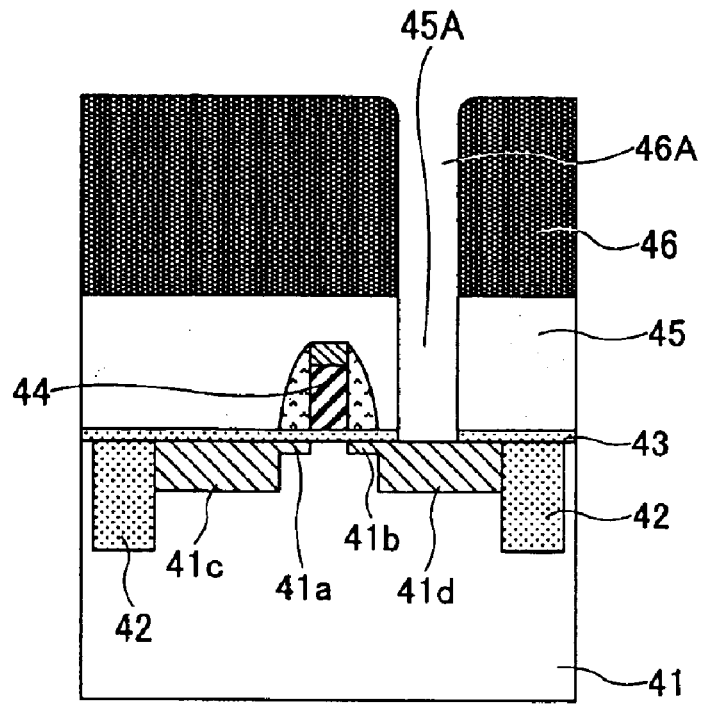

In a process illustrated in FIG. 4D, the film 47 is removed through dissolution in a solvent or selective etching. In a process illustrated in FIG. 4E, the inter-layer insulation film 45 is etched by using the resist film 46 as the mask, and a contact hole 45A is formed in the inter-layer insulation film 45 corresponding to the resist aperture 46A.

Figure 4F:
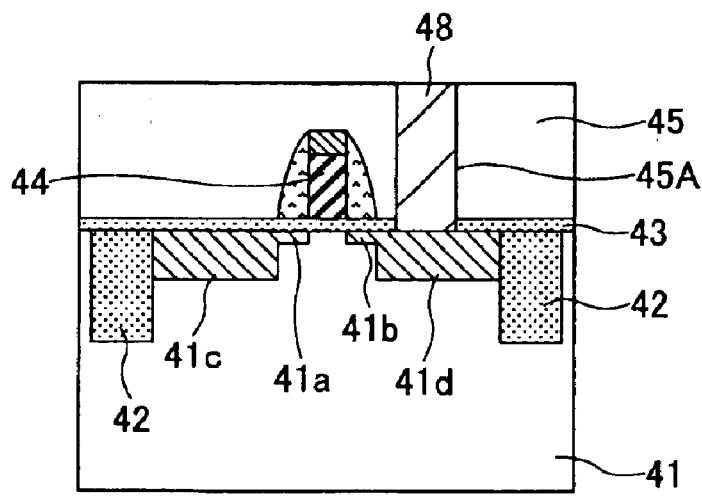

In a process illustrated in FIG. 4F, a conductive plug 48 is in contact with the drain area 41d in the contact hole 45A.

According to the third embodiment, the reflow is caused in the resist pattern in the state where the deformation of the resist pattern is restricted by using a pattern of high heat-resistance temperature, and the edge roughness is eliminated. As a result, it is possible to effectively form not only a convex pattern such as the above-mentioned gate electrode but also a concave pattern such as the contact hole.

As mentioned above, the semiconductor apparatus fabrication method according to the third embodiment is applicable to not only a fine patterning process on a resist pattern having edge roughness but also a process for forming a larger pattern.

A description will now be given, with reference to FIGS. 5A through 5F, of a semiconductor apparatus fabrication method according to the fourth embodiment of the present invention wherein the same parts as those parts described above are designated by the same reference numerals and the description thereof is omitted.

Figure 5A:
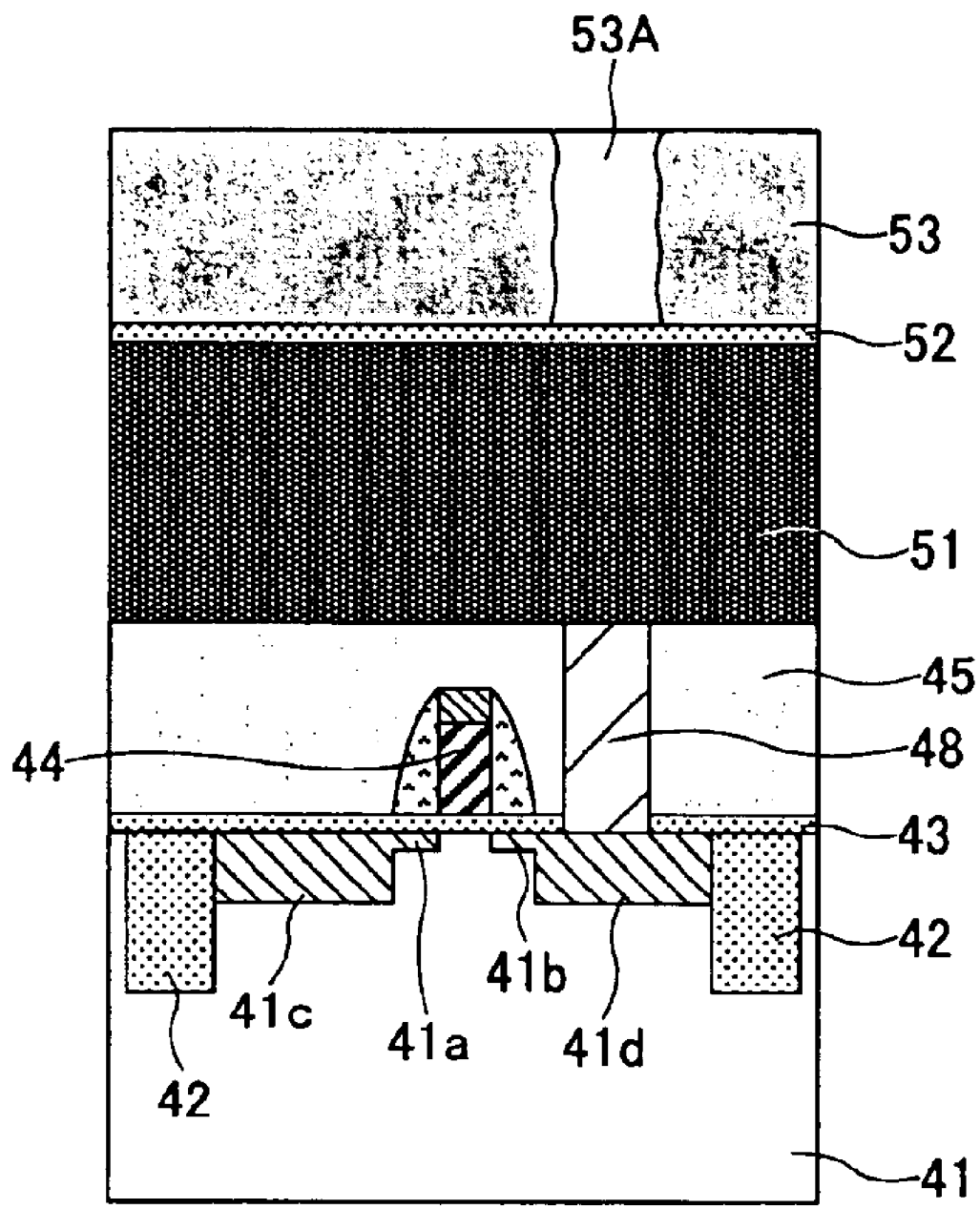
FIGS. 5A through 5F are diagrams for explaining fabrication processes of a semiconductor apparatus fabrication method according to a fourth embodiment of the present invention.

A process illustrated in FIG. 5A follows the process in FIG. 4F. In the process in FIG. 5A, an inter-layer insulation film 51 is provided on the inter-layer insulation film 45, and a chemically amplified resist 53 is provided on the inter-layer insulation film 51 via an antireflection film 52. Furthermore, a resist aperture 53A is provided in the resist 53 corresponding to a via plug to be formed in the inter-layer insulation film 51. The resist aperture 53A has an undulating sidewall due to edge roughness as shown in FIG. 5A.

Figure 5B:
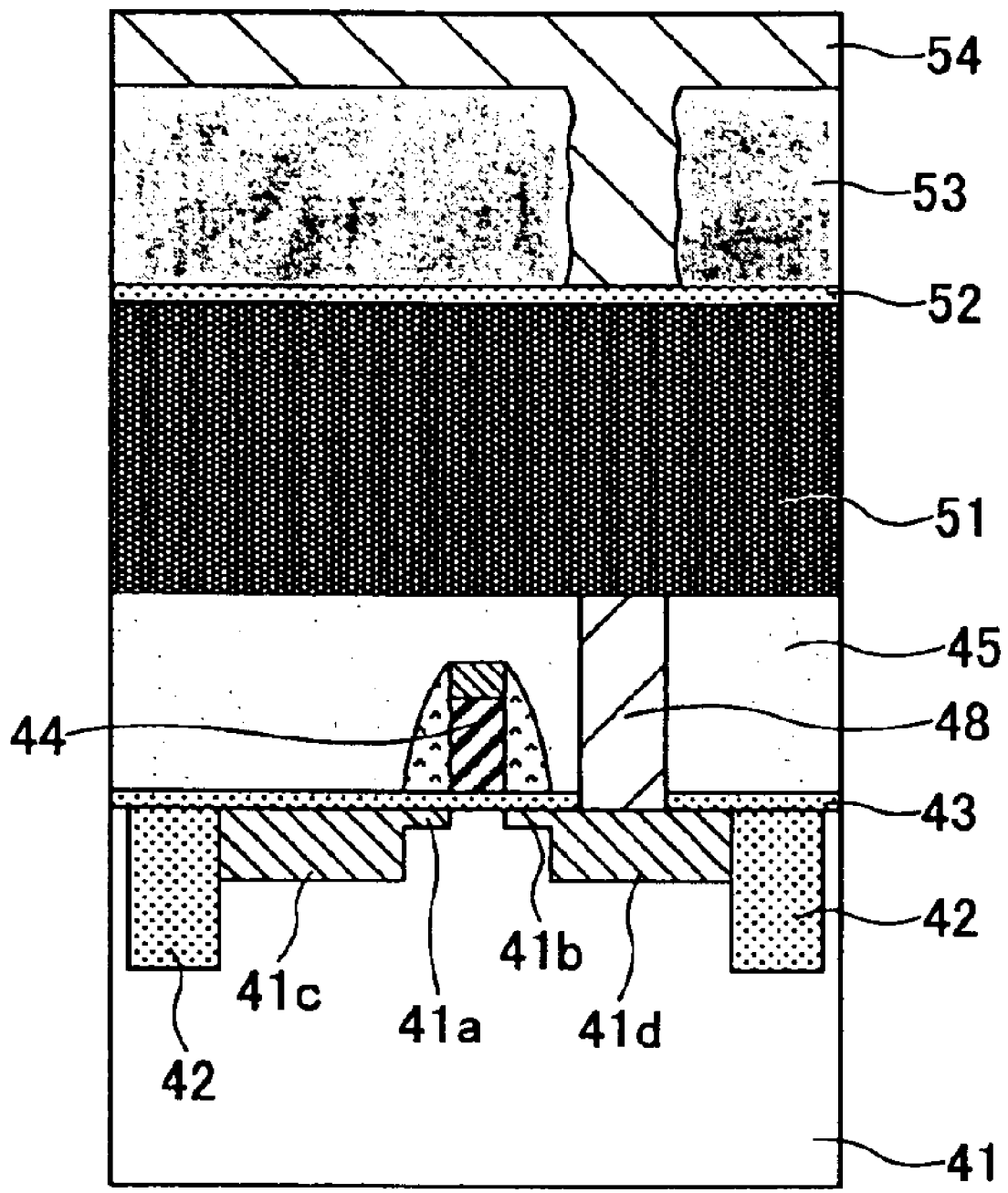
Figure 5C:
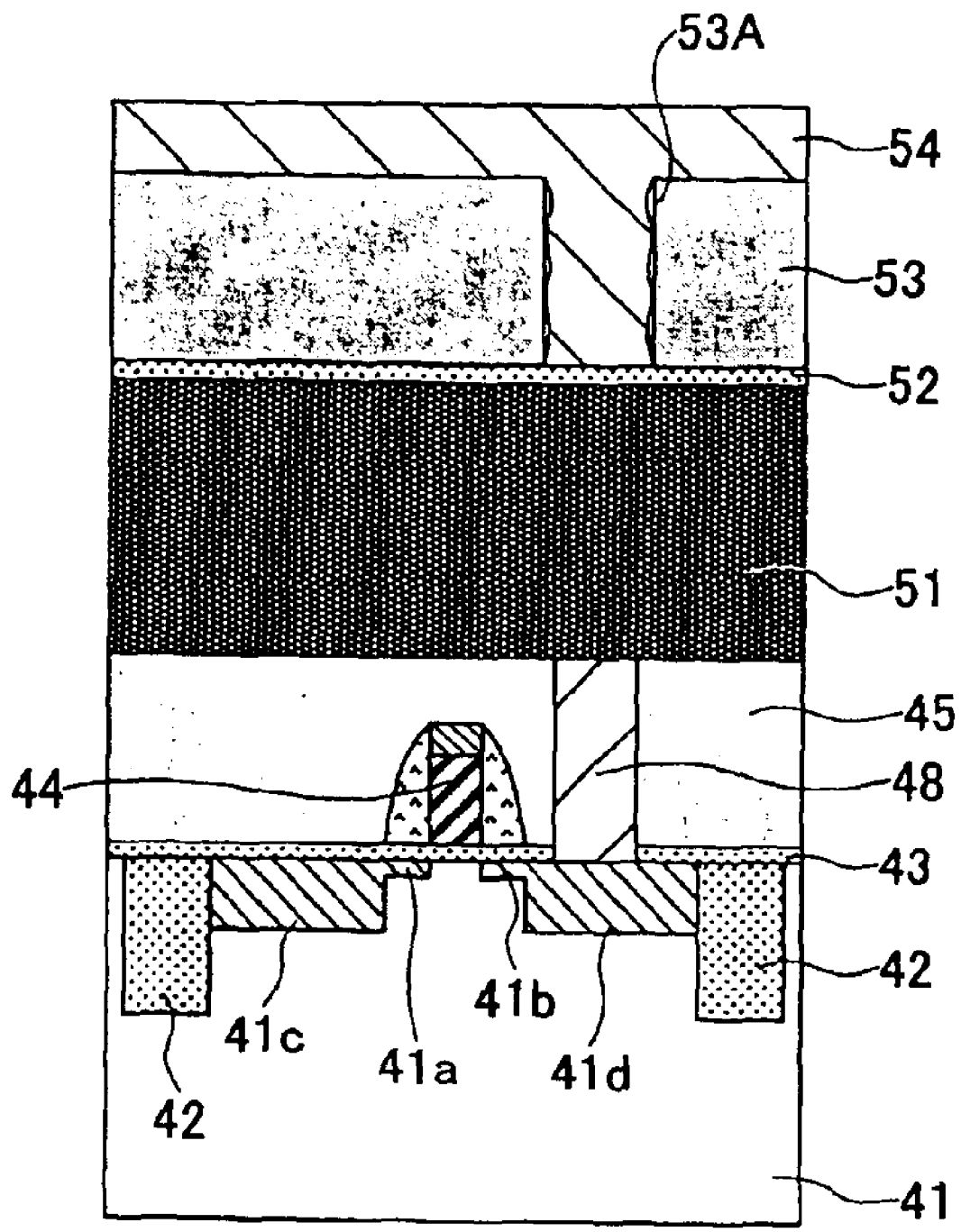

In a process illustrated in FIG. 5B, a film 54, which is formed of a resin film, an inorganic film or a metal film as mentioned above, is provided on the resist 53 in FIG. 5A so that the resist aperture 53A can be filled. In a process illustrated in FIG. 5C, the structure in FIG. 5B is heated at a temperature higher than the softening temperature of the resist 53 and lower than the heat-resistance temperature of the film 54 in order to cause reflow in the resist 53 under restriction by the film 54. As a result, it is possible to effectively eliminate the edge roughness in the resist aperture 53A.

Figure 5D:
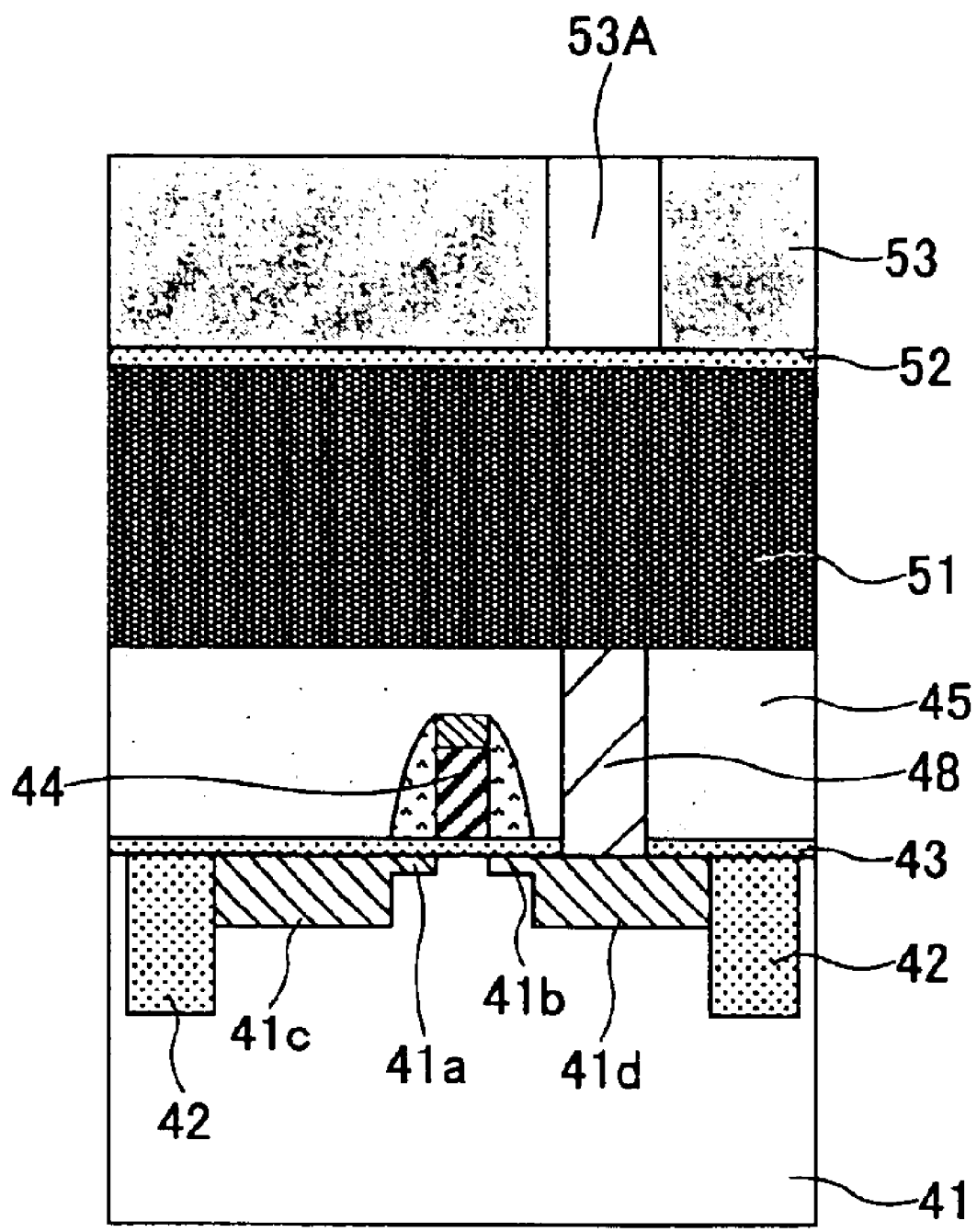
Figure 5E:
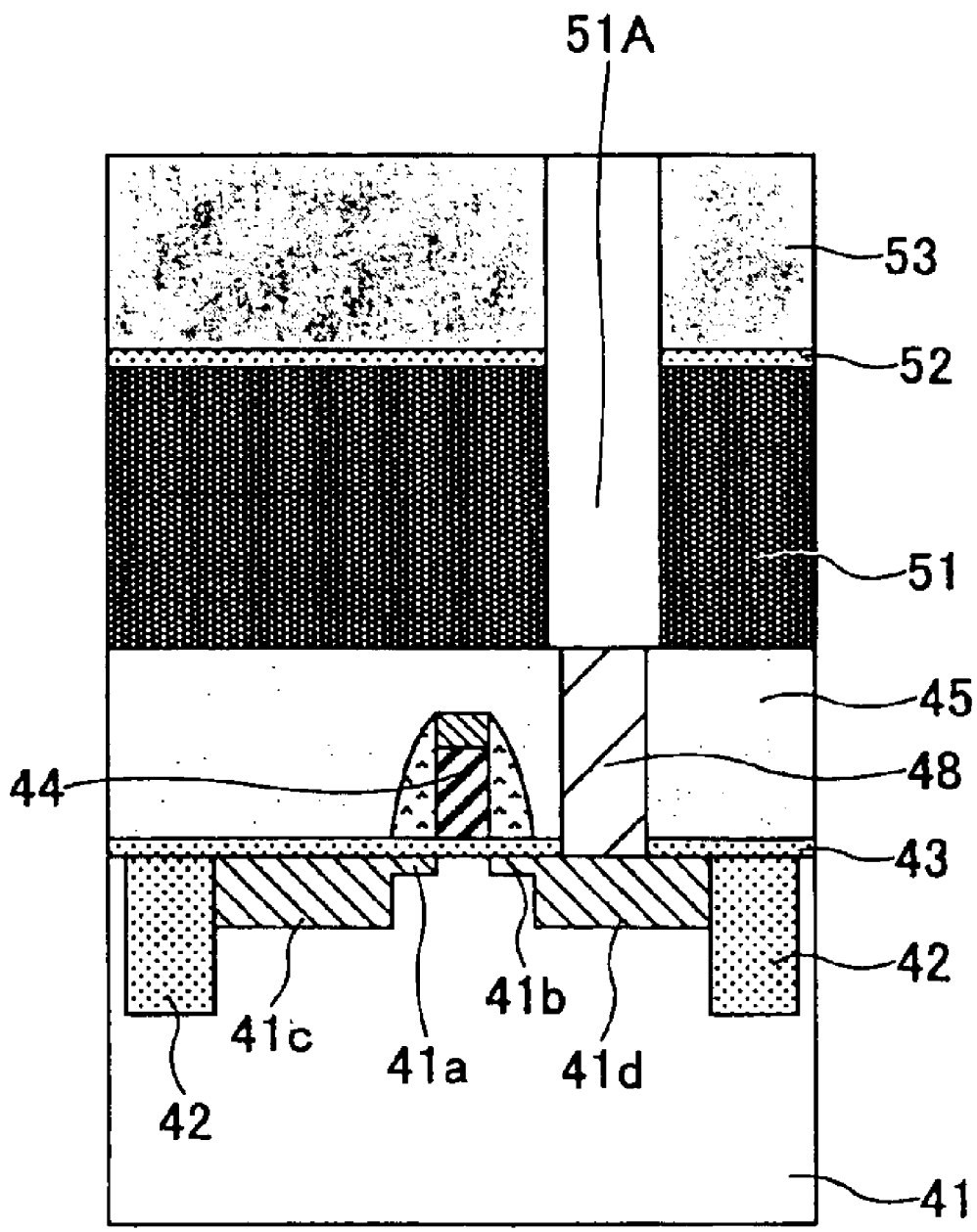

In a process illustrated in FIG. 5D, the film 54 is removed through solution or selective etching. In a process illustrated in FIG. 5E, the antireflection film 52 and the inter-layer insulation film 51 are dry-etched by using the resulting resist 53 as the mask, and a via hole 51A is formed in the inter-layer insulation film 51 so as to expose the conductive plug 48.

Figure 5F:
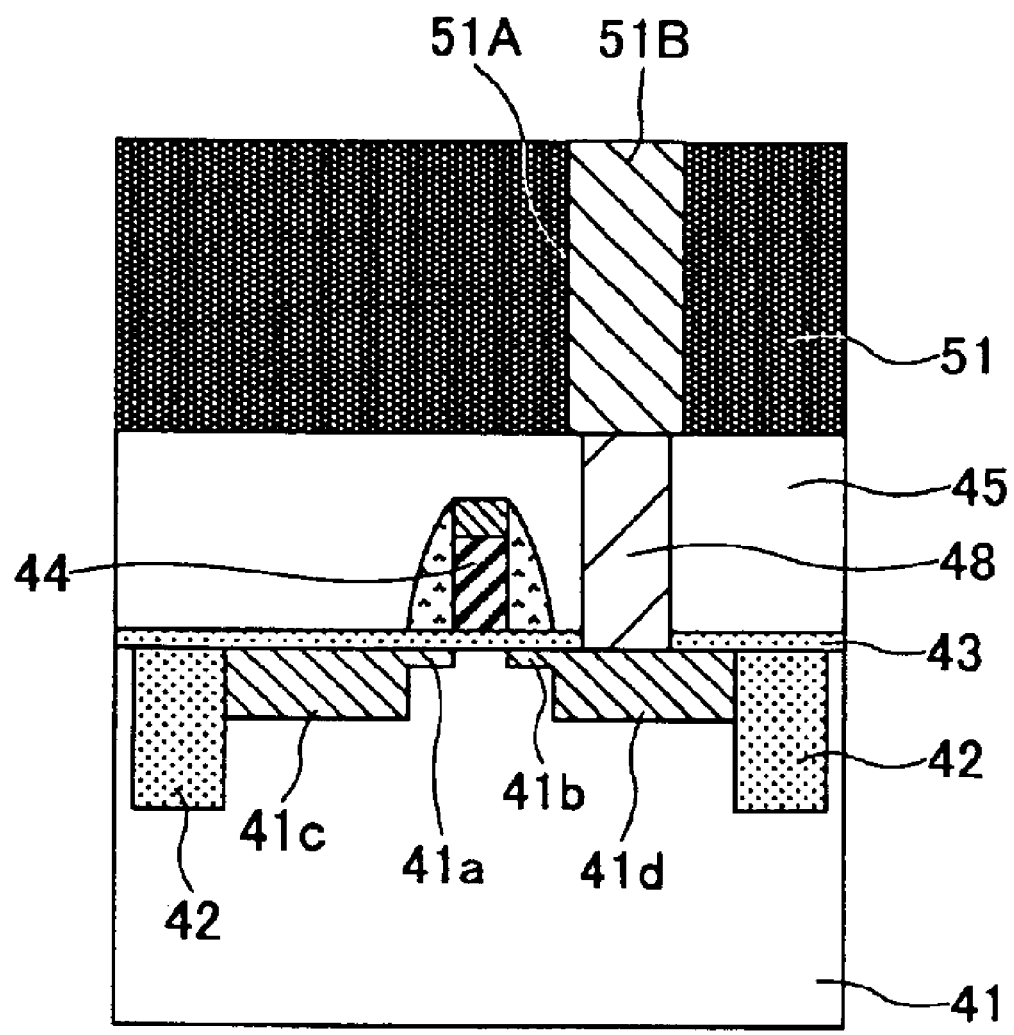

In a process illustrated in FIG. 5F, the via hole 51A is filled with a conductive material such as W (Tungsten), and it is possible to obtain a via plug 51B in the via hole 51A by performing a CMP (Chemical Mechanical Polishing) process.

The present invention is not limited to the specifically disclosed embodiments, and variations and modifications may be without departing from the scope of the present invention.

What is claimed is:

1. A semiconductor apparatus fabrication method, comprising the steps of:
    forming a resist pattern;
    forming a film whose heat-resistance temperature is higher than softening temperature of said resist pattern so as to spatially define sidewall surfaces of said resist pattern;
    heating said resist pattern at a temperature higher than said softening temperature of the resist pattern and lower than said heat-resistance temperature of the film in a state where said film restricts said resist pattern in order to cause reflow;
    removing said film; and
    patterning an underlayer of said resist pattern by using said resist pattern in which said reflow is caused as a mask.

2. The semiconductor apparatus fabrication method as claimed in claim 1, wherein said film is an organic film whose softening temperature, which serves as said heat-resistance temperature, is higher than said softening temperature of the resist pattern.

3. The semiconductor apparatus fabrication method as claimed in claim 2, wherein said organic film is soluble in one of an organic solvent and water.

4. The semiconductor apparatus fabrication method as claimed in claim 3, wherein said organic film is selected from a group of polyacrylic acid, polyvinylacetal, polyvinylpyrrolidone, polyvinylalcohol, polyethyleneimine, polyethyleneoxide, styrene-(anhydrous) maleic acid copolymer, methylvinylether-(anhydrous) maleic acid copolymer, polyvinyl amine resin, polyallylamine, water soluble oxazoline group containing resin, water soluble melamine resin, water soluble urea resin, alkyd resin, and sulfonamide resin.

5. The semiconductor apparatus fabrication method as claimed in claim 3, wherein said organic film is selected from a group of polyimide, polyacetal, polybutylene terephthalate, polyethylene terephthalate, syndiotactic polystyrene, poly phenylene sulfide, polyetherether ketone, liquid crystal polymer, fluorine resin, polyethernitrile, polycarbonate, modified poly phenyleneether, polysulfone, polyethersulfone, polyacrylate, polyalylate, polyamideimide, thermoplastic polyimide, phenol resin, urea resin, melamine resin, alkyd resin, unsaturated polyester, epoxy resin, diallyl phthalate resin, silicon resin, and polyurethane.

6. The semiconductor apparatus fabrication method as claimed in claim 2, wherein said step of forming the film includes a coating step.

7. The semiconductor apparatus fabrication method as claimed in claim 1, further comprising a step of accreting a release agent on a surface of said resist pattern after the step of forming the resist pattern and before the step of forming the film.

8. The semiconductor apparatus fabrication method as claimed in claim 1, wherein said film is an inorganic film whose melting point, which serves as said heat-resistance temperature, is higher than said softening temperature of the resist pattern.

9. The semiconductor apparatus fabrication method as claimed in claim 8, wherein said inorganic film is formed in accordance with one of a coating method, a sputtering method and a plasma CVD method.

10. The semiconductor apparatus fabrication method as claimed in claim 1, wherein said film is a metal film whose melting paint, which serves as said heat-resistance temperature, is higher than said softening temperature of the resist pattern.

11. The semiconductor apparatus fabrication method as claimed in claim 10, wherein said metal film is formed in accordance with a sputtering method.

12. The semiconductor apparatus fabrication method as claimed in claim 1, wherein said resist pattern is formed as a convex pattern on said underlayer.

13. The semiconductor apparatus fabrication method as claimed in claim 1, wherein said resist pattern has an aperture for exposing said underlayer.

14. The semiconductor apparatus fabrication method as claimed in claim 1, wherein said underlayer is a semiconductor film.

15. The semiconductor apparatus fabrication method as claimed in claim 1, wherein said underlayer is an inorganic insulation film.

16. The semiconductor apparatus fabrication method as claimed in claim 1, wherein said underlayer is an organic insulation film.

17. The semiconductor apparatus fabrication method as claimed in claim 1, wherein said underlayer retains an antireflection film.

18. The semiconductor apparatus fabrication method as claimed in claim 1, further comprising a step of patterning a film under said underlayer by using said underlayer as a mask.

* * * * *